US006501150B2

United States Patent
Welser

(12) United States Patent
(10) Patent No.: US 6,501,150 B2
(45) Date of Patent: Dec. 31, 2002

(54) FUSE CONFIGURATION FOR A SEMICONDUCTOR APPARATUS

(75) Inventor: Wolfgang Welser, Heimstetten (DE)

(73) Assignee: Infineon Technologies AG, Munich (DE)

(*) Notice: Subject to any disclaimer, the term of this patent is extended or adjusted under 35 U.S.C. 154(b) by 107 days.

(21) Appl. No.: 09/784,768

(22) Filed: Feb. 15, 2001

(65) Prior Publication Data

US 2001/0028076 A1 Oct. 11, 2001

(30) Foreign Application Priority Data

Feb. 15, 2000 (DE) .......................... 100 06 528

(51) Int. Cl.⁷ .............................................. H01L 29/00
(52) U.S. Cl. ...................... 257/529; 257/209; 438/601
(58) Field of Search ................... 257/209, 529; 438/601

(56) References Cited

U.S. PATENT DOCUMENTS

| | | | | |
|---|---|---|---|---|
| 4,393,577 A | * | 7/1983 | Imai .......................... 438/295 |
| 5,156,896 A | * | 10/1992 | Katoh et al. .................. 428/81 |
| 5,389,814 A | * | 2/1995 | Srikrishnan et al. ........ 257/529 |
| 5,421,958 A | * | 6/1995 | Fathauer et al. ............... 216/48 |
| 5,798,475 A | * | 8/1998 | Reynes et al. ........... 102/202.5 |
| 5,882,998 A | * | 3/1999 | Sur et al. ..................... 438/601 |
| 5,970,361 A | * | 10/1999 | Kumomi et al. ............ 438/409 |
| 6,220,164 B1 | * | 4/2001 | Laucht et al. ............ 102/202.5 |

FOREIGN PATENT DOCUMENTS

DE 3116356 A1 6/1982

OTHER PUBLICATIONS

S. Barret et al., Porous silicon as a material in microsensor technology, Sensors and Actuators A, 33 (1992) 19–24.*
P. Steiner et al., Micromachining applications of porous silicon, Thin Solid Films, 255 (1995) 52–58.*

* cited by examiner

Primary Examiner—Richard Elms
Assistant Examiner—Christian D. Wilson
(74) Attorney, Agent, or Firm—Laurence A. Greenberg; Werner H. Stemer; Ralph E. Locher

(57) ABSTRACT

A fuse configuration for a semiconductor apparatus is described. The fuse configuration has a semiconductor material disposed underneath the fuse and is made porous by implantation and subsequent etching, so that it provides a thermal insulation. The thermal insulation protects the semiconductor body when the fuse is blown due to a decreased energy requirement for blowing the fuse.

5 Claims, 1 Drawing Sheet

FUSE CONFIGURATION FOR A SEMICONDUCTOR APPARATUS

BACKGROUND OF THE INVENTION

Field of the Invention

The present invention relates to a fuse configuration for a semiconductor apparatus. The fuse configuration contains a semiconductor body, an insulation layer of which at least part is provided on a surface of the semiconductor body, and a metal layer in the form of a web which is disposed on the insulation layer and has a constriction, which forms a fuse, at at least one point.

One preferred field of application for the fuses (melting fuse links) is semiconductor memories. For example, in semiconductor memories, they can activate redundant memory cells when memory cells fail.

Fuses are also suitable for storing information since their state, namely "burnt out" or "not burnt out", is assessed as "0" or "1", or vice versa.

When blowing a fuse, which is essential for it to operate, a high current is used which leads to a significant output and loss of energy. The heat produced in the process is dissipated into the semiconductor body via an insulating layer provided between the fuse and the semiconductor body, and can thus lead to the formation of cracks in the semiconductor body. These cracks can adversely affect the operation of adjacent components, or even destroy them.

SUMMARY OF THE INVENTION

It is accordingly an object of the invention to provide a fuse configuration for a semiconductor apparatus which overcomes the above-mentioned disadvantages of the prior art devices of this general type, which is configured such that it is virtually impossible for cracks to be produced when blowing a fuse.

With the foregoing and other objects in view there is provided, in accordance with the invention, a fuse configuration for a semiconductor apparatus. The fuse configuration contains a semiconductor body having a surface and a semiconductor area formed of a porous semiconductor material, an insulation layer, at least a part of the insulation layer is disposed on the surface of the semiconductor body, and a metal layer in a form of a web disposed on the insulation layer. The metal layer has a constriction forming and functioning as a fuse at at least one point. The semiconductor area in the semiconductor body formed of the porous semiconductor material is disposed underneath the constriction and functions as a thermal insulation.

In the case of the fuse configuration of the type mentioned initially, the object is achieved according to the invention in that the semiconductor area in the semiconductor body underneath the constriction provides thermal insulation. In this case, the semiconductor area is preferably formed by a porous semiconductor material. The porous semiconductor material can be formed by implantation and subsequent etching. Boron or some other suitable material (i.e. a p-type dopant) can be used for the implantation. A HF mixture can advantageously be used for etching.

The fuse configuration according to the invention thus preferably has the porous semiconductor material in the area where the fuse is burnt, the porous semiconductor material being produced by implantation and etching from the semiconductor material. The term semiconductor material in this case primarily refers to silicon. However, the invention is not limited to silicon as the semiconductor material. Other semiconductor materials can be used, such as AIII-BV semiconductor materials.

The porous semiconductor material is sufficiently robust for further technological processing which is necessary when producing a memory configuration. However, it provides thermal insulation, which results in a major advantage. Specifically, even a small current surge is sufficient to destroy the fuse, because the thermal insulation provided by the porous semiconductor material results in that only a small energy loss occurs.

"Blowing" of the fuse in this way requires much less energy than the conventional procedure, in which the fuse is disposed on an insulation layer provided on the semiconductor body. In addition, only the porous semiconductor material is destroyed, thus forming a "crumple zone". This results in that the semiconductor material in the rest of the semiconductor body remains completely intact. In particular, no dangerous cracks that could destroy adjacent components are formed there.

The conversion of the semiconductor material to a porous state also allows self-supporting links to be formed in particular in the insulation layer, over which the fuses are then located.

In the fuse configuration according to the invention, the advantageous interaction of the insulation layer with the crumple zone formed underneath it by the porous semiconductor material is particularly advantageous. The porous semiconductor material increases the thermal insulation underneath the insulation layer so that even a small current surge is sufficient to burn or blow the fuse. Furthermore, only the crumple zone formed by the porous material is adversely affected by this blowing or burning process, so that damage to the rest of the semiconductor body is reliably avoided.

Other features which are considered as characteristic for the invention are set forth in the appended claims.

Although the invention is illustrated and described herein as embodied in a fuse configuration for a semiconductor apparatus, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
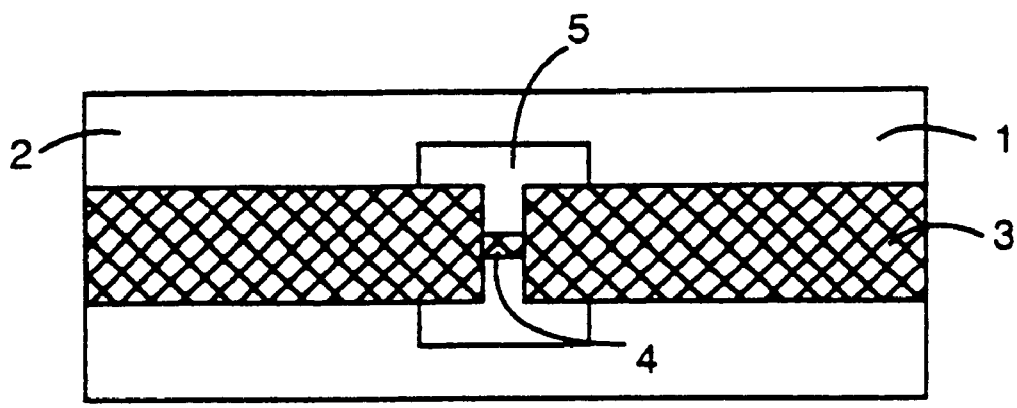
FIG. 1 is a diagrammatic, plan view of a fuse configuration according to the invention.

In all the figures of the drawing, sub-features and integral parts that correspond to one another bear the same reference symbol in each case. Referring now to the figures of the drawing in detail and first, particularly, to FIG. 1 thereof, there is shown a fuse configuration having a silicon semiconductor body 1 on which an insulation layer 2 composed, for example, of silicon dioxide is provided. A metal layer 3 that is in the form of a web and has a constriction 4 which forms a fuse is located on the insulation layer 2.

The constriction 4 is caused to melt by a current surge through the metal layer 3 or by the influence of a laser beam, so that the electrical connection through the metal layer 3 is interrupted. The energy lost during this process is dissipated into the silicon semiconductor body 1, where it can lead to damage to adjacent components.

Figure 2:
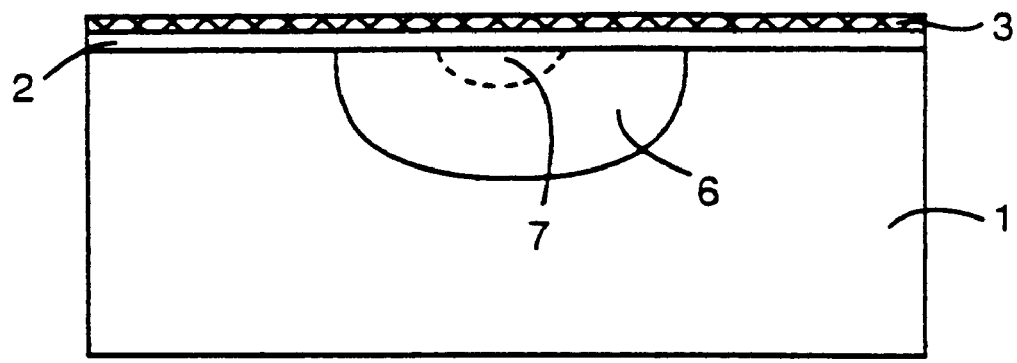
FIG. 2 is a sectional view of the fuse configuration shown in FIG. 1.

According to the invention, in order to prevent this, an extraneous material, such as boron or some other p-type dopant which expands somewhat by subsequent diffusion, is introduced by implantation in an area 5 of the silicon semiconductor body 1. The area 5 is then also etched using a HF mixture so that, finally, a porous silicon 6 is produced in the area 5 and its vicinity, as is shown in FIG. 2. The porous silicon provides thermal insulation so that a considerably smaller current surge is sufficient to cause the constriction 4 to melt. Less energy is thus required than with the conventional fuse configuration. Furthermore, when blowing the fuse, only the porous silicon that forms a "crumple zone" is damaged, thus avoiding the production of cracks in the silicon semiconductor body 1 away from the porous silicon.

If required, the semiconductor body 1 can be removed completely in an area underneath the constriction 4 by the implantation and subsequent etching, so that a "bridge" is produced in a region 7 there. The "bridge" can be caused to melt under the influence of an even smaller current surge, since it is thermally completely insulated from the semiconductor body 1.

I claim:

1. A fuse configuration for a semiconductor apparatus, comprising:

a semiconductor body having a surface and a semiconductor area formed of a porous semiconductor material;

an insulation layer, at least a part of said insulation layer disposed on said surface of said semiconductor body; and a metal layer in a form of a web disposed on said insulation layer, said metal layer having a constriction forming and functioning as a fuse at at least one point, said semiconductor area in said semiconductor body formed of said porous semiconductor material disposed underneath said constriction and functioning as a thermal insulation.

2. The fuse configuration according to claim 1, wherein said porous semiconductor material is formed by implantation and subsequent etching of the semiconductor body in said semiconductor area.

3. The fuse configuration according to claim 2, wherein boron is used for the implantation.

4. The fuse configuration according to claim 2, wherein a p-type dopant is used for the implantation.

5. The fuse configuration according to claim 2, wherein a HF mixture is used for the subsequent etching.

* * * * *